US008018325B2

(12) United States Patent
Isozu

(10) Patent No.: US 8,018,325 B2
(45) Date of Patent: Sep. 13, 2011

(54) REMOTE CONTROL SYSTEM, REMOTE CONTROLLER, INFORMATION PROCESSING APPARATUS, REMOTE CONTROL METHOD, INFORMATION PROCESSING METHOD, AND COMPUTER PROGRAM THEREFOR

(75) Inventor: Masaaki Isozu, Tokyo (JP)

(73) Assignee: Sony Corporation, Tokyo (JP)

( * ) Notice: Subject to any disclaimer, the term of this patent is extended or adjusted under 35 U.S.C. 154(b) by 1125 days.

(21) Appl. No.: 11/525,921

(22) Filed: Sep. 25, 2006

(65) Prior Publication Data

US 2007/0080939 A1    Apr. 12, 2007

(30) Foreign Application Priority Data

Oct. 7, 2005    (JP) .................................. 2005-294454

(51) Int. Cl.
G08C 19/16    (2006.01)
(52) U.S. Cl. ..................... 340/12.1; 340/12.15; 345/158
(58) Field of Classification Search ............. 340/825.69, 340/825.62, 825.57, 825; 348/14.05, 114, 348/161, 211.99, 734
See application file for complete search history.

(56) References Cited

U.S. PATENT DOCUMENTS

| 4,903,012 | A  | * | 2/1990  | Ohuchi ......................... 345/178 |
| 5,905,961 | A  | * | 5/1999  | Sanders et al. ............. 455/456.2 |
| 6,313,866 | B1 | * | 11/2001 | Akamatsu et al. ............. 348/51 |
| 6,518,959 | B1 | * | 2/2003  | Ito et al. ......................... 345/175 |
| 6,862,019 | B2 | * | 3/2005  | Kobayashi et al. ........... 345/173 |
| 7,158,117 | B2 | * | 1/2007  | Sato et al. ..................... 345/158 |
| 7,746,321 | B2 | * | 6/2010  | Banning ....................... 345/157 |
| 2004/0021645 | A1 | * | 2/2004 | Kobayashi et al. ........... 345/173 |
| 2005/0200325 | A1 | * | 9/2005 | Kim et al. ................. 318/568.12 |
| 2005/0253806 | A1 | * | 11/2005 | Liberty et al. ................ 345/156 |

FOREIGN PATENT DOCUMENTS

| JP | 7-322367     |   | 12/1995 |
| JP | 2003-140630  |   | 5/2003  |
| JP | 2004-96685   |   | 3/2004  |
| JP | 2004-341892  |   | 12/2004 |
| JP | 2004341892   | A * | 12/2004 |

* cited by examiner

Primary Examiner — Daniel Wu
Assistant Examiner — Rufus Point
(74) Attorney, Agent, or Firm — Oblon, Spivak, McClelland, Maier & Neustadt, L.L.P.

(57) ABSTRACT

A remote control system includes an information processing apparatus and a remote controller. The remote controller includes a start notification transmitter that transmits a notification for causing the information processing apparatus to start recording an inter-device distance. The information processing apparatus includes a conversion table showing an association between amounts of change in the inter-device distance within predetermined time lengths and operations corresponding to the amounts of change; a start notification receiver; a distance measurement unit that periodically measures the inter-device distance; a measured distance storage unit that stores a measured inter-device distance in association with a measurement sequence; a determination unit that determines whether the amount of change in distance and the time length during which the change has occurred match any of the amounts of change in the conversion table; and an operation executor that executes the associated operation when the match is obtained.

18 Claims, 11 Drawing Sheets

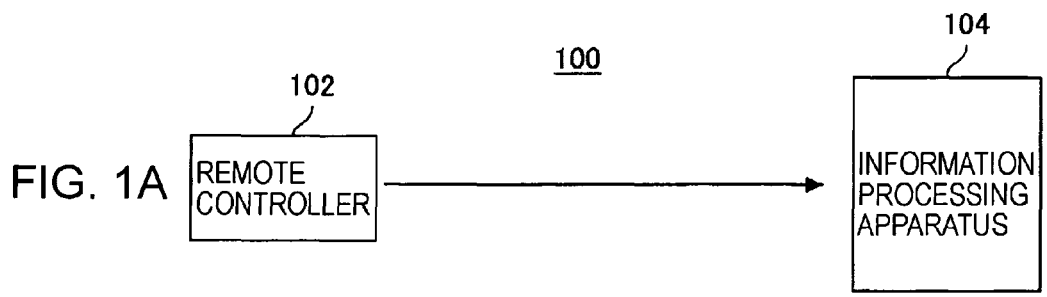
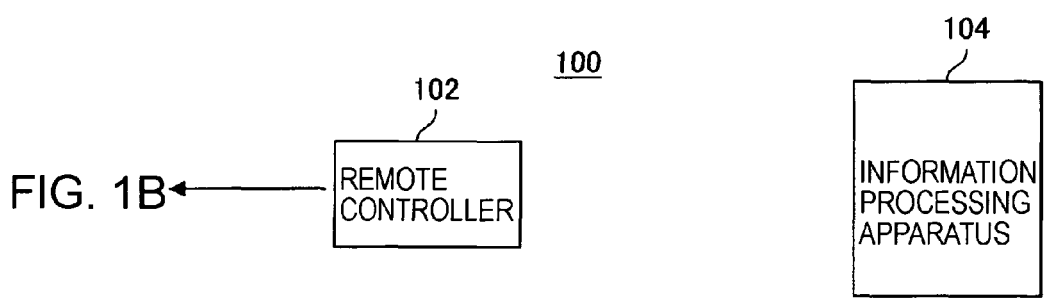
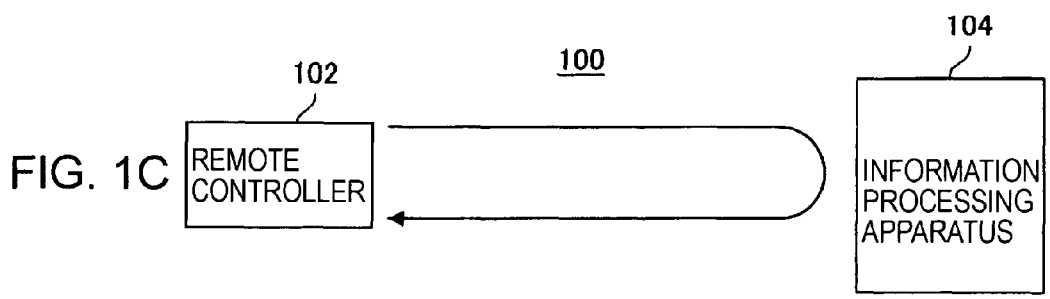
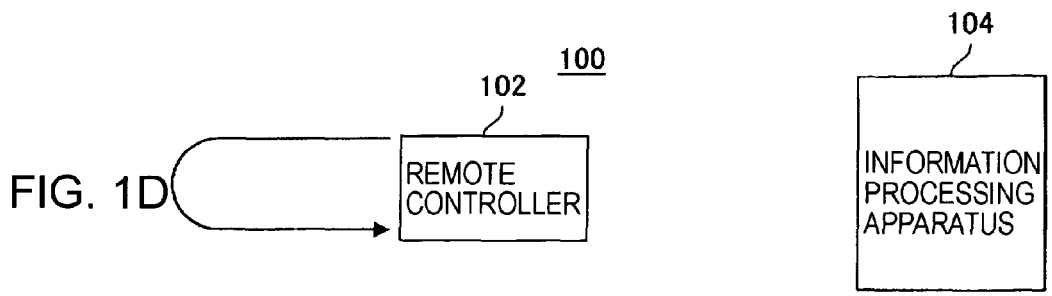

| ELAPSED TIME | MEASURED VALUE | EVENT |
|---|---|---|
| 0 | 160 | START: BUTTON IS PRESSED |
| 100 | 140 | END: 500 ms HAVE ELAPSED |
| 200 | 100 | |
| 300 | 50 | |
| 400 | 120 | |
| 500 | 180 | |

| CONDITION NO. | TIME CONDITION | DISTANCE CONDITION | OPERATION |
|---|---|---|---|
| 1 | WITHIN 500 ms | DISTANCE IS REDUCED BY 50 cm OR MORE | ENLARGE ICON |
| 2 | WITHIN 300 ms | DISTANCE IS INCREASED BY 30 cm OR MORE | REDUCE ICON |
| 3 | AFTER 500 ms | DISTANCE IS REDUCED BY 70 cm OR MORE | CHANGE MENU |
| 4 | AFTER 0 sec | DISTANCE IS 3 m OR MORE | INCREASE SOUND VOLUME |
| 5 | AFTER 100 ms | DISTANCE IS 30 cm OR MORE | TRANSFER FILE |
|  | AFTER 500 ms | DISTANCE IS 10 cm OR LESS |  |
| 6 | AFTER 100 ms | DISTANCE IS 30 cm OR MORE | OBTAIN FILE |
|  | AFTER 300 ms | DISTANCE IS 10 cm OR LESS |  |
|  | AFTER 500 ms | DISTANCE IS 30 cm OR MORE |  |
| 7 | WITHIN 300 ms | DISTANCE IS INCREASED BY 100 cm OR MORE | DISPLAY SIZE×4 |
| 8 | WITHIN 2000 ms | DISTANCE IS INCREASED BY 100 cm OR MORE | DISPLAY SIZE×2 |

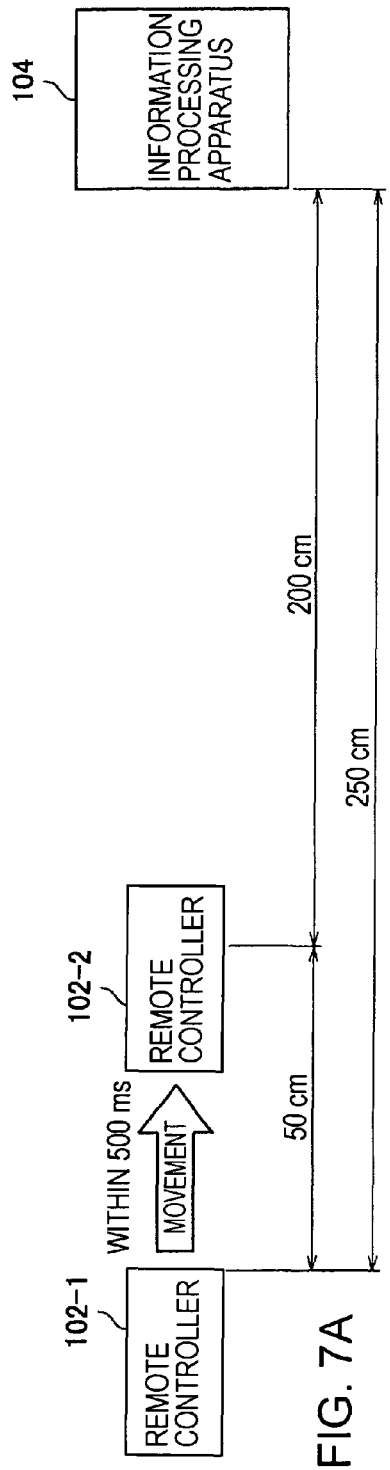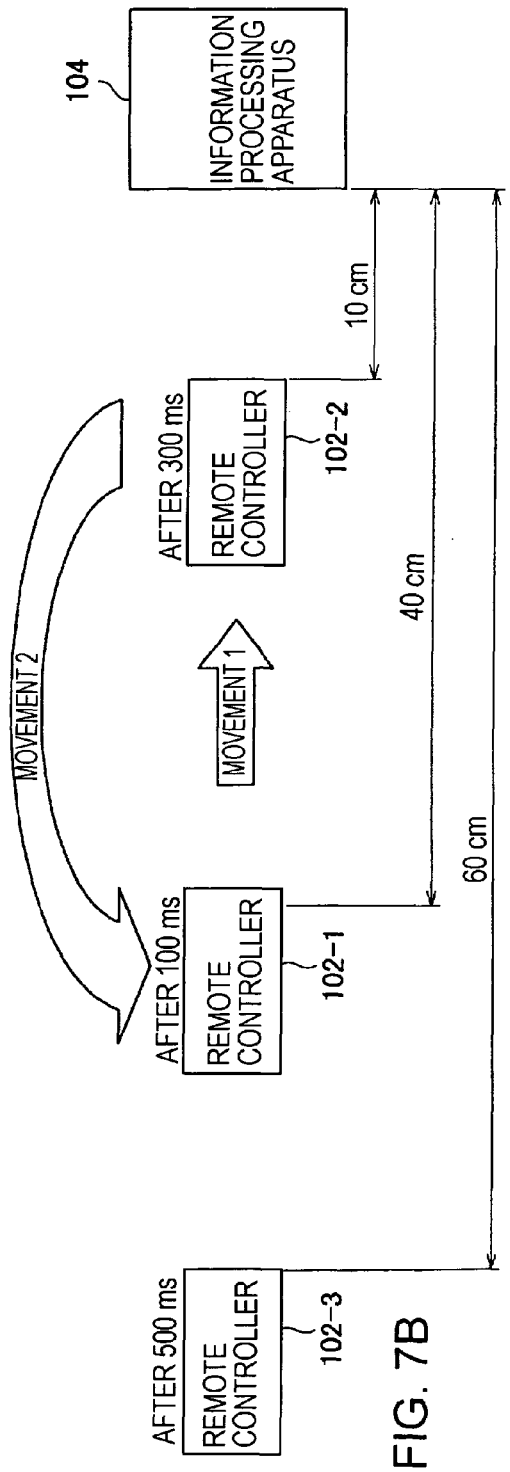

REMOTE CONTROL SYSTEM, REMOTE CONTROLLER, INFORMATION PROCESSING APPARATUS, REMOTE CONTROL METHOD, INFORMATION PROCESSING METHOD, AND COMPUTER PROGRAM THEREFOR

CROSS REFERENCES TO RELATED APPLICATIONS

The present invention contains subject matter related to Japanese Patent Application JP 2005-294454 filed in the Japanese Patent Office on Oct. 7, 2005, the entire contents of which are incorporated herein by reference.

BACKGROUND OF THE INVENTION

1. Field of the Invention

The present invention relates to remote control systems, remote controllers, information processing apparatuses, remote control methods, information processing methods, and computer programs therefore. More particularly, the present invention relates to a remote control system or the like capable of controlling, using a remote controller, an information processing apparatus in accordance with the distance from the remote controller to the information processing apparatus.

2. Description of the Related Art

Many of known remote controllers including, for example, television remote controllers are equipped with a button (cross key or the like) for instructing the up, down, left, and right directions. A user uses the button to give an instruction to an information processing apparatus, such as a television, to be controlled. For example, the user can instruct the up, down, left, and right directions using the button of the remote controller and select a desired item from among a plurality of items included in a menu displayed on a display screen of the information processing apparatus.

As has been described above, the user can easily give a two-dimensional instruction, such as movement in the x-axis (horizontal) direction and the y-axis (vertical) direction to a selection item, using the known remote controller described above. However, when the user wants to select one of a nearby image positioned near the user (foreground) and an image positioned far away from the user (background), it is necessary to use a remote controller capable of giving an instruction in the z-axis direction (foreground and background). Current information processing apparatuses are equipped with, in addition to a button indicating the x- and y-axes directions, a button or a lever instructing the z-axis direction, thereby being able to give an instruction in the z-axis direction.

However, when the user uses the button to give an instruction in the z-axis direction, the user has difficulty in understanding the relationship between the foreground/background directions and the button, and it is thus difficult for the user to give an intuitive instruction, as in the case of the x- and y-axes directions. When the user uses the lever to give an instruction in the z-axis direction, the user can associate the foreground/background directions with the directions in which the lever is tilted (or moved). Accordingly, the user can give an instruction more easily than with the button. However, the lever only allows the user to instruct either the foreground or the background direction. Therefore, when the user wants to perform various operations on the information processing apparatus, it is necessary for the user to use the lever in combination with other buttons or the like to give the associated instructions, which is complicated.

A system for allowing an information processing apparatus to execute a predetermined operation in accordance with the distance between a remote controller and the information processing apparatus has been proposed (for example, see Japanese Unexamined Patent Application Publication No. 2003-140630). According to this display system, the distance between a television and a remote controller is measured upon pressing a button of the remote controller, and the size of an icon displayed on the television is changed according to the measured distance. Also, an apparatus for converting a hand motion of a user into three-dimensional positional information and executing an operation associated with the motion has been proposed (for example, see Japanese Unexamined Patent Application Publication No. 2004-341892). According to this instruction input apparatus, a hand motion of a user in the z-axis direction is detected, and, when the hand motion coincides with a predetermined motion, it is determined that the user has performed an operation associated with the motion, such as clicking, double-clicking, or dragging.

SUMMARY OF THE INVENTION

According to a display system described in Japanese Unexamined Patent Application Publication No. 2003-140630, an icon of an optimal size is displayed according to the distance between a television and a remote controller upon pressing of a button of the remote controller. That is, the displayed icon is changed only on the basis of the distance between the television and the remote controller upon pressing the button. It is thus difficult to perform various operations. According to an instruction input apparatus described in Japanese Unexamined Patent Application Publication No. 2004-341892, an instruction that is usually given using a mouse, such as clicking or double-clicking, is given not using a mouse, but by the motion of a finger. This does not allow the user to give an intuitive instruction in the z-axis direction.

It is desirable to provide a remote control system, a remote controller, an information processing apparatus, a remote control method, an information processing method, and a computer program therefore for allowing a user to give an intuitive instruction in the z-axis direction and to allow the information processing apparatus to execute various operations in accordance with the instruction in the z-axis direction.

According to an embodiment of the present invention, there is provided a remote control system including an information processing apparatus and a remote controller that remotely controls the information processing apparatus. The remote controller includes a start notification transmitter that transmits, to the information processing apparatus, a start notification for causing the information processing apparatus to start recording an inter-device distance, which is the distance from the information processing apparatus to the remote controller.

The information processing apparatus includes the following elements: a conversion table showing an association between time-dependent amounts of change, which are the amounts of change in the inter-device distance within predetermined lengths of time, and operations corresponding to the time-dependent amounts of change; a start notification receiver that receives the start notification from the remote controller; a distance measurement unit that measures the inter-device distance periodically at a predetermined time interval; a measured distance storage unit that stores a measured value of the inter-device distance, which is measured by the distance measurement unit, in association with a sequence of measurements; a determination unit that determines whether the amount of change in the inter-device distance, which is determined from two or more than two measured values stored in the measured distance storage unit, and the length of time during which the change in the inter-device distance has occurred match any of the time-dependent amounts of change, which are set in the conversion table; and an operation executor that executes, when the match is obtained by the determination unit, the operation associated with the corresponding time-dependent amount of change.

According to the embodiment of the present invention, the information processing apparatus having received the start notification from the remote controller starts measuring the distance from the information processing apparatus to the remote controller (hereinafter may also be referred to as the "inter-device distance"). The information processing apparatus measures the inter-device distance periodically at a predetermined time interval and records the measured value in association with the measurement sequence so that the sequence of measurements is clear. The information processing apparatus is preliminary equipped with a conversion table. The conversion table defines an association between time-dependent amounts of change, which are the amounts of change in the inter-device distance within predetermined lengths of time, and operations corresponding to the time-dependent amounts of change. The information processing apparatus checks two or more than two measured values recorded therein against the time-dependent amounts of change, which are set in the conversion table, and determines whether the amount of change in the inter-device distance, which is determined from the two or more than two measured values, and the length of time during which the change in the inter-device distance has occurred match any of the time-dependent amounts of change. If the match is obtained as a result of the determination, the information processing apparatus executes the operation associated with the corresponding time-dependent amount of change.

With this structure, the information processing apparatus executes the operation associated in advance with the change in the distance between the information processing apparatus and the remote controller and the time during which the change in the inter-device distance has occurred. That is, when the movement of the remote controller in the z-axis direction toward the information processing apparatus matches a combination of a time condition and a distance condition, the information processing apparatus executes the operation associated in advance with the combination of conditions. Therefore, the user can give an intuitive instruction in the z-axis direction. Not only the distance condition, but a combination of the time condition and the distance condition is associated with the operation to be executed by the information processing apparatus. There are many combinations of the time condition and the distance condition, each of which is associated with the corresponding operation. Therefore, the information processing apparatus is allowed to execute various operations according to the control by the remote controller.

According to another embodiment of the present invention, there is provided an information processing apparatus remotely controlled by a remote controller. The information processing apparatus includes the following elements: a distance measurement unit that measures an inter-device distance, which is the distance from the information processing apparatus to the remote controller, periodically at a predetermined time interval; a conversion table showing an association between time-dependent amounts of change, which are the amounts of change in the inter-device distance within predetermined lengths of time, and operations corresponding to the time-dependent amounts of change; a measured distance storage unit that stores a measured value of the inter-device distance, which is measured by the distance measurement unit, in association with a sequence of measurements; a determination unit that determines whether the amount of change in the inter-device distance, which is determined from two or more than two measured values stored in the measured distance storage unit, and the length of time during which the change in the inter-device distance has occurred match any of the time-dependent amounts of change, which are set in the conversion table; and an operation executor that executes, when the match is obtained by the determination unit, the operation associated with the corresponding time-dependent amount of change.

According to the embodiment of the present invention, the information processing apparatus executes the operation associated in advance with the change in the distance between the information processing apparatus and the remote controller and the time during which the change in the inter-device distance has occurred. That is, when the movement of the remote controller in the z-axis direction toward the information processing apparatus matches a combination of a time condition and a distance condition, the information processing apparatus executes the operation associated in advance with the combination of conditions. Therefore, the user can give an intuitive instruction in the z-axis direction. Not only the distance condition, but a combination of the time condition and the distance condition is associated with the operation to be executed by the information processing apparatus. Therefore, the information processing apparatus is allowed to execute various operations according to the control by the remote controller.

The measured distance storage unit may store the measured value in association with time information specifying a time at which the measured value is measured by the distance measurement unit. The time information specifying the time at which the measured value is measured by the distance measurement unit includes, for example, time and date information obtained from an internal clock of the information processing apparatus, elapsed-time information from the measurement start time of the distance measurement unit, or the like. With this structure, the time during which a change in the inter-device distance has occurred can be computed using the time information associated with two or more than two measured values.

The determination unit may perform the determination periodically at the predetermined time interval. That is, the determination can be performed in real time every time the distance measurement unit measures the inter-device distance.

The determination unit may perform the determination when the measured value measured by the distance measurement unit is a predetermined value. In this case, the measurement of the inter-device distance by the distance measurement unit may be ended when the measured value is a predetermined value, or may be continued. The predetermined value may be, for example, the maximum value among distance values included in the distance conditions set in the conversion table.

The information processing apparatus may further include a start notification receiver that receives, from the remote controller, a start notification for instructing starting of recording of the inter-device distance. In this case, the distance measurement unit may start measuring the inter-device distance when the start notification receiver receives the start notification. With this structure, the information processing apparatus may start measuring the inter-device distance upon reception of an instruction from the remote controller. That is, it is not necessary for the information processing apparatus to measure the inter-device distance at all times. When the remote controller transmits a start notification upon reception of an instruction from the user, the measurement of the inter-device distance, the determination, and the corresponding operation are performed by the information processing apparatus only when the user intends to perform the remote control. Therefore, the information processing apparatus is prevented from performing the measurement of the inter-device distance, the determination, and the corresponding operation in the case where the user moves the remote controller while not intending to remotely control the information processing apparatus.

The determination unit may perform the determination after a predetermined period of time has elapsed from the start of the measurement of the inter-device distance by the distance measurement unit. The necessary time may be, for example, the longest time from among time periods included in the time conditions set in the conversion table.

The information processing apparatus may further include an end notification receiver that receives, from the remote controller, an end notification instructing ending of recording of the inter-device distance. In this case, the determination unit may perform the determination when the end notification receiver receives the end notification. When the remote controller transmits an end notification to the information processing apparatus upon reception from an instruction from the user, the information processing apparatus ends the measurement of the inter-device distance upon reception of the instruction from the user to end the remote control. That is, the measurement of the inter-device distance, the determination, and the corresponding operation are performed by the information processing apparatus only when the user intends to perform the remote control. Therefore, the information processing apparatus is prevented from performing the measurement of the inter-device distance, the determination, and the corresponding operation in the case where the user moves the remote controller while not intending to remotely control the information processing apparatus.

The distance measurement unit may include the following elements: a sensor that transmits a packet to the remote controller, receives a response packet associated with the transmitted packet from the remote controller, and computes a round-trip transmission time of the packet on the basis of necessary time from transmission of the packet to reception of the response packet; and a distance calculator that calculates the inter-device distance on the basis of the round-trip transmission time. Particularly it is preferable that the sensor perform the above-described processing using ultra wide band (UWB) communication. With this structure, the information processing apparatus can accurately and quickly measure the inter-device distance.

The information processing apparatus may further include a display unit. The operation executor may change the display state of an item displayed on the display unit. The item includes, for example, an icon, an image, or a menu.

The display unit may be capable of displaying the item in three dimensions.

According to another embodiment of the present invention, there is provided a computer program for allowing a computer to function as the above-described information processing apparatus. The computer program is stored in a storage unit of the computer. When loaded and executed by a central processing unit (CPU) of the computer, the computer program allows the computer to function as the above-described information processing apparatus. Also, a computer-readable recording medium having the computer program recorded thereon is provided. The recording medium includes, for example, a magnetic disk or an optical disk.

According to another embodiment of the present invention, there is provided an information processing method for an information processing apparatus remotely controlled by a remote controller. The method includes the following steps: measuring an inter-device distance, which is the distance from the information processing apparatus to the remote controller, periodically at a predetermined time interval; recording a measured value of the inter-device distance in association with a sequence of measurements; determining, on the basis of a conversion table showing an association between time-dependent amounts of change, which are the amounts of change in the inter-device distance within predetermined lengths of time, and operations corresponding to the time-dependent amounts of change, whether the amount of change in the inter-device distance, which is determined from two or more than two recorded measured values, and the length of time during which the change in the inter-device distance has occurred match any of the time-dependent amounts of change, which are set in the conversion table; and executing, when the match is obtained as a result of the determination, the operation associated with the corresponding time-dependent amount of change.

According to another embodiment of the present invention, there is provided a remote controller for remotely controlling an information processing apparatus. The remote controller includes the following elements: a distance measurement unit that measures an inter-device distance, which is the distance from the information processing apparatus to the remote controller, periodically at a predetermined time interval; a conversion table showing an association between time-dependent amounts of change, which are the amounts of change in the inter-device distance within predetermined lengths of time, and operations corresponding to the time-dependent amounts of change; a measured distance storage unit that stores a measured value of the inter-device distance, which is measured by the distance measurement unit, in association with a sequence of measurements; a determination unit that determines whether the amount of change in the inter-device distance, which is determined from two or more than two measured values stored in the measured distance storage unit, and the length of time during which the change in the inter-device distance has occurred match any of the time-dependent amounts of change, which are set in the conversion table; and an operation command unit that commands, when the match is obtained by the determination unit, the information processing apparatus to execute the operation associated with the corresponding time-dependent amount of change.

The remote controller may further include a recording start instruction unit that gives an instruction to the distance measurement unit to start recording the inter-device distance. In this case, the distance measurement unit may start measuring the inter-device distance upon reception of the instruction from the recording start instruction unit.

The determination unit may perform the determination after a predetermined period of time has elapsed from the start of the measurement of the inter-device distance by the distance measurement unit.

The remote controller may further include a recording end instruction unit that gives an instruction to the distance measurement unit to end recording the inter-device distance. The determination unit may perform the determination upon reception of the instruction from the recording end instruction unit.

The remote controller may further include a command display unit. In this case, the operation command unit may allow the command display unit to display information specifying an operation commanded to be executed by the information processing apparatus. The information specifying the operation commanded to be executed by the information processing apparatus includes, for example, text indicating the details of the operation or an image implying the details of the operation. The command display unit may display the text or image.

According to another embodiment of the present invention, there is provided a computer program for allowing a computer to function as the above-described remote controller.

According to another embodiment of the present invention, there is provided a remote control method for a remote controller for remotely controlling an information processing apparatus. The remote control method includes the following steps: measuring an inter-device distance, which is the distance from the information processing apparatus to the remote controller, periodically at a predetermined time interval; recording a measured value of the inter-device distance in association with a sequence of measurements; determining, on the basis of a conversion table showing an association between time-dependent amounts of change, which are the amounts of change in the inter-device distance within predetermined lengths of time, and operations corresponding to the time-dependent amounts of change, whether the amount of change in the inter-device distance, which is determined from two or more than two recorded measured values, and the length of time during which the change in the inter-device distance has occurred match any of the time-dependent amounts of change, which are set in the conversion table; and commanding, when the match is obtained as a result of the determination, the information processing apparatus to execute the operation associated with the corresponding time-dependent amount of change.

As has been described above, according to the embodiments of the present invention, there is provided a remote control system or the like, which is capable of allowing a user to intuitively give an instruction in the z-axis direction and allowing an information processing apparatus to execute various operations in accordance with the instruction in the z-axis direction.

BRIEF DESCRIPTION OF THE DRAWINGS

FIGS. 1A to 1D are diagrams of the outline of a remote control system according to a first embodiment of the present invention;

FIG. 5 is a diagram of the stored contents of a measured distance storage unit of the first embodiment;

FIG. 6 is a diagram of a conversion table of the first embodiment;

FIGS. 7A and 7B are diagrams illustrating conditions set in the conversion table of the first embodiment;

DESCRIPTION OF THE PREFERRED EMBODIMENTS

Figure 2:
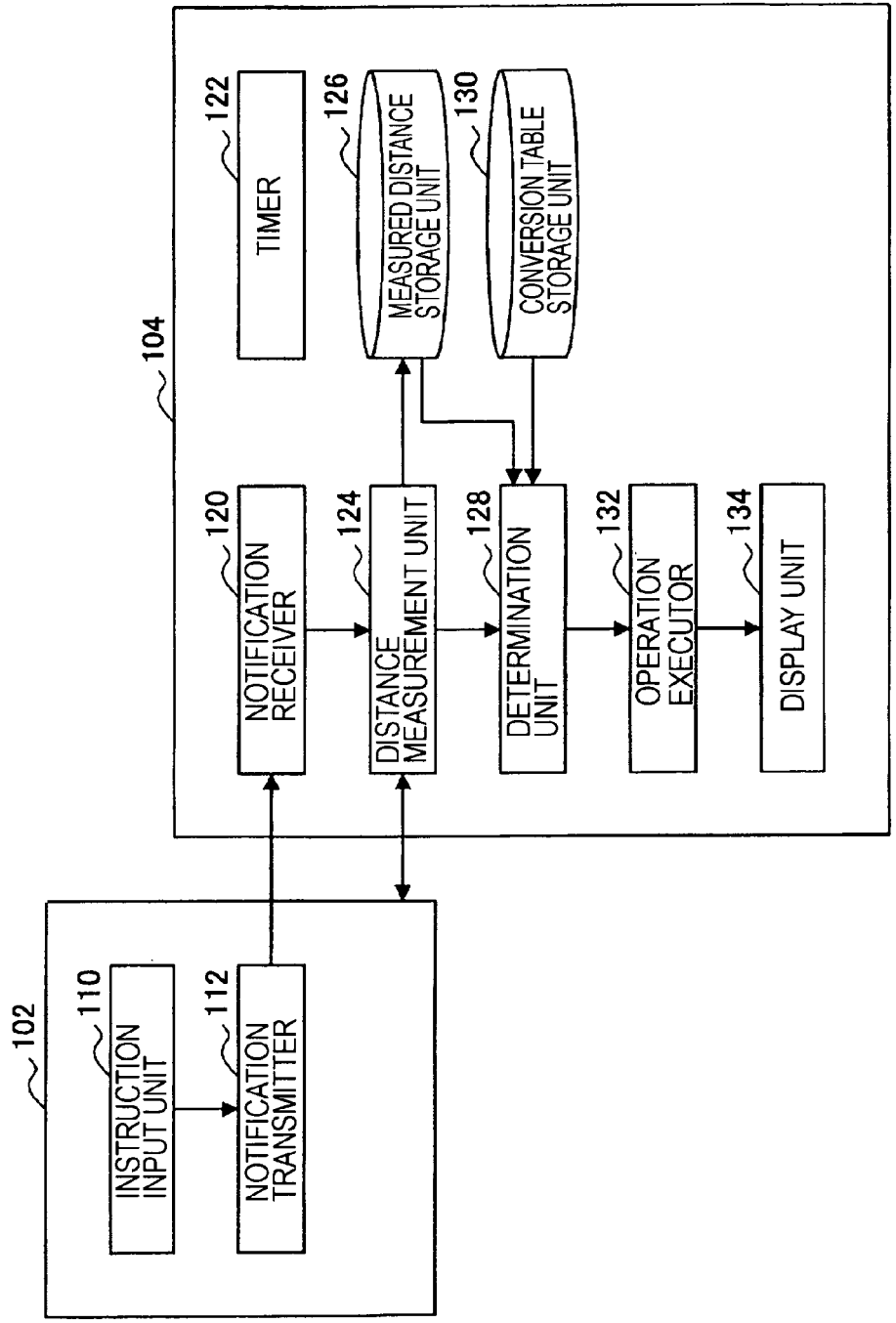
FIG. 2 is a functional block diagram of a remote controller and an information processing apparatus of the first embodiment.

Preferred embodiments of the present invention will be described in detail with reference to the accompanying drawings. In the following description and the accompanying drawings, elements having substantially the same function and structure are given the same reference numerals, and repeated descriptions thereof will be omitted.

In the following description, a remote control system according to an embodiment of the present invention is applied to a remote control system 100 including a remote controller 102 and an information processing apparatus 104 controlled by the remote controller 102. The distance between the remote controller 102 and the information processing apparatus 104 changes when a user moves the remote controller 102. In the remote control system 100, this change serves as an operation instruction given from the remote controller 102 to the information processing apparatus 104, thereby allowing remote control of the information processing apparatus 104 using the remote controller 102. To this end, in the remote control system 100, the information processing apparatus 104 executes various operations in accordance with changes in the distance between the remote controller 102 and the information processing apparatus 104 within predetermined periods of time.

FIGS. 1A to 1D schematically show a method of controlling, by the user, the information processing apparatus 104 using the remote controller 102 in the remote control system 100 according to the embodiment of the present invention. The user allows the information processing apparatus 104 to execute specific operations associated in advance-with movements of the remote controller 102 including: moving toward the information processing apparatus 104, as in F$ig$. 1A; moving away from the information processing apparatus 104, as in FIG. 1B; moving toward and then away from the information processing apparatus 104, as in FIG. 1C; and moving away from and then toward the information processing apparatus 104, as in F$ig$. 1D. That is, the user moves the remote controller 102 so as to change the distance between the information processing apparatus 104 and the remote controller 102 in a predetermined manner within a predetermined period of time,-thereby allowing the information processing apparatus 104 to execute an operation associated in advance with the time and the amount of change in the distance.

As shown in FIGS. 1A to 1D, there are four possible patterns for changes in the distance between the remote controller 102 and the information processing apparatus 104: the case where the distance between the remote controller 102 and the information processing apparatus 104 (hereinafter may also be referred to as the "inter-device distance") is reduced (F$ig$. 1A); the case where the inter-device distance is increased (FIG. 1B); the case where the inter-device distance is reduced and then increased (FIG. 1C); and the case where the inter-device distance is increased and then reduced (F$ig$.

1D). By associating operations to be executed by the information processing apparatus 104 with the patterns of changes in the inter-device distance, the information processing apparatus 104 can execute different operations depending on the patterns of changes in the inter-device distance. Even in the case of the same change pattern, when operations to be executed by the information processing apparatus 104 are associated according to the amount of change, the information processing apparatus 104 can execute different operations depending on the amount of change in the inter-device distance. Even in the case of the same change pattern or the same amount of change, when operations to be executed by the information processing apparatus 104 are associated according to the time during which the change in the inter-device distance has occurred, the information processing apparatus 104 can execute different operations depending on the time during which the change has occurred. In this manner, in the remote control system 100, the information processing apparatus 104 can execute various operations according to the state of change in the distance between the remote controller 102 and the information processing apparatus 104.

Hereinafter, the case where the information processing apparatus 104 measures the distance between the remote controller 102 and the information processing apparatus 104 is described as a first embodiment, and the case where the remote controller 102 measures the distance between the remote controller 102 and the information processing apparatus 104 is described as a second embodiment.

First Embodiment

In the remote control system 100 according to the first embodiment, the information processing apparatus 104 measures the distance from the information processing apparatus 104 to the remote controller 102 and executes an operation associated in advance with the measured distance or the like. The functional structure of the remote controller 102 and the information processing apparatus 104 will be described.

The remote controller 102 is a device that can remotely control the information processing apparatus 104. Preferably, the remote controller 102 is portable by the user and has dimensions and weight that can be moved easily. Exemplary remote controllers include a television remote controller, a cellular phone, a personal digital assistant (PDA), and a portable music player.

The remote controller 102 is equipped with, for example, an instruction input unit 110 and a notification transmitter 112. The instruction input unit 110 is an example of a recording start instruction unit and a recording end instruction unit. The instruction input unit 110 receives an instruction from the user and provides the received instruction to the notification transmitter 112. The instruction from the user includes a start instruction for starting the recording of the inter-device distance, which is the distance from the information processing apparatus 104 to the remote controller 102, and an end instruction for ending the recording of the inter-device distance. Specifically, for example, the remote controller 102 is equipped with a button. When the button is pressed, the instruction input unit 110 may input a start instruction, and, when the pressing of the button is released, the instruction input unit 110 may input an end instruction as the instruction from the user to the notification transmitter 112. The instruction input unit 110 may have a plurality of buttons.

Upon reception of the start instruction from the instruction input unit 110, the notification transmitter 112 transmits a start notification for allowing the information processing apparatus 104 to start the measurement of the inter-device distance to the information processing apparatus 104. Also, upon reception of the end instruction from the instruction input unit 110, the notification transmitter 112 transmits an end notification for allowing the information processing apparatus 104 to end the measurement of the inter-device distance to the information processing apparatus 104. That is, the measurement of the inter-device distance by the information processing apparatus 104 is performed between the user's pressing of the button and the releasing of the button.

The information processing apparatus 104 is equipped with, for example, a notification receiver 120, a timer 122, a distance measurement unit 124, a measured distance storage unit 126, a determination unit 128, a conversion table storage unit 130, an operation executor 132, and a display unit 134.

The notification receiver 120 is an example of a start notification receiver and an end notification receiver. The notification receiver 120 receives the start notification and the end notification from the notification transmitter 112 of the remote controller 102 and provides the received start notification or the received end notification to the distance measurement unit 124. Communication between the notification transmitter 112 and the notification receiver 120 may be wireless, such as infrared communication, Bluetooth, or ultra wide band (UWB), or via wire.

In response to the start of the measurement of the inter-device distance by the distance measurement unit 124, the timer 122 is turned on and starts measuring time. In response to the end of the measurement of the inter-device distance by the distance measurement unit 124, the timer 122 is turned off and ends the measurement of time. That is, the timer 122 measures the time elapsed from the start of the measurement of the inter-device distance.

The distance measurement unit 124 measures the distance from the information processing apparatus 104 to the remote controller 102 periodically at a predetermined time interval. Specifically, the distance measurement unit 124 measures the inter-device distance periodically at the predetermined time interval (e.g., every 100 ms, every 10 ms, etc.) between the reception of the start notification and the reception of the end notification from the notification receiver 120. That is, upon reception of the start notification from the notification receiver 120, the distance measurement unit 124 starts measuring the inter-device distance. Upon reception of the end notification from the notification receiver 120, the distance measurement unit 124 ends the measurement of the inter-device distance. The distance measurement unit 124 may end the measurement after a predetermined period of time has elapsed from the start of the measurement of the inter-device distance. Alternatively, the distance measurement unit 124 may end the measurement when the measured value of the inter-device distance is a predetermined value.

Several inter-device distance measurement methods are possible to be performed by the distance measurement unit 124. For example, the distance measurement unit 124 may be a radar for measuring the distance to the remote controller 102 by emitting an electromagnetic wave to the remote controller 102 and measuring the reflected wave. Alternatively, the distance measurement unit 124 may use an electromagnetic wave to measure the inter-device distance on the basis of the intensity of the electromagnetic wave. Also, the distance measurement unit 124 may use an acoustic wave to measure the distance. In the first embodiment, the distance measurement unit 124 performs UWB communication with the remote controller 102 to measure the inter-device distance. This will be described in detail with reference to FIG. 3.

Figure 3:
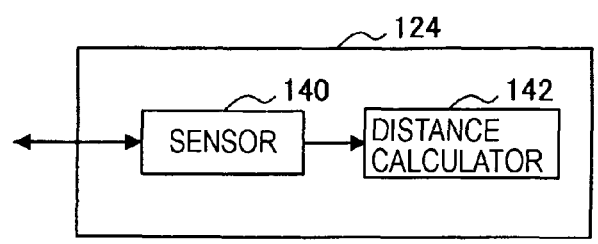
FIG. 3 is a functional block diagram of a distance measurement unit of the first embodiment.

FIG. 3 is a detailed diagram of the distance measurement unit 124. As shown in FIG. 3, the distance measurement unit 124 includes a sensor 140 and a distance calculator 142. The sensor 140 performs UWB communication with a reception-side sensor (not shown) of the remote controller 102 to obtain the time during which a radio wave propagates through the space between the information processing apparatus 104 and the remote controller 102.

For example, a method disclosed in Japanese Unexamined Patent Application Publication No. 2004-258009 may be used as a measurement method using the UWB communication. That is, the sensor 140 transmits a packet (whose contents can be anything; may be empty or may be a beacon) to the receiver-side sensor of the remote controller 102. The sensor 140 has a counter. Upon transmission of the packet, the sensor 140 starts the counter to start measuring time. The receiver-side sensor detects the packet transmitted from the sensor 140 and resends the packet to the sensor 140 after a predetermined period of time, which is an integer factor of a predetermined unit time, has elapsed from the detection. Upon detection of the resent packet, the sensor 140 stops the counter. The sensor 140 subtracts the integer factor of the above-described unit time from the necessary time from the transmission of the packet to the reception of the resent packet, which is measured by the counter, thereby computing the round-trip transmission time of the packet. The above-described predetermined unit time is computed from the quotient obtained by dividing the wireless communication range of the sensor 140 by the transmission speed of the wireless signal (packet). The distance calculator 142 calculates the inter-device distance on the basis of the round-trip transmission time computed by the sensor 140. Generally, the time is lineally proportional to the distance. Given Y is the distance, and X is the time, then Y=X * a+b (where a and b are arbitrary values). In case of measurement errors, it is preferable that the distance calculator 142 absorb the errors by calibration or the like.

With the above-described measurement method using the UWB communication, the distance measurement unit 124 can measure the inter-device distance more accurately and quickly than with other measurement methods. Since the sensor 140, in place of the notification receiver 120, can receive the start notification and the end notification, it is only necessary for the information processing apparatus 104 to have one UWB communication unit. Referring back to FIG. 2, the functional structure of the information processing apparatus 104 will be described further.

The distance measurement unit 124 records the measured value of the inter-device distance (hereinafter may also be simply referred to as the "measured value") in association with a sequence of measurements in the measured distance storage unit 126. That is, the distance measurement unit 124 records the measured value in the measured distance storage unit 126 in such a manner that the measurement sequence of the measured value is clear. Several methods are possible to associate the measured value with the sequence of measurements. For example, one method stores the measured value in the order of measurements in a predetermined area of the measured distance storage unit 126. Another method assigns a number to the measured value in the order of measurements and records the measured value together with the assigned number. Another method uses an internal clock of the information processing apparatus 104 to obtain the measurement time and date and records the measured value along with the time and date. In the first embodiment, using the timer 122, each measured value is recorded along with the time elapsed from the start of the measurement to the time of the measurement of each measured value.

Figure 4:
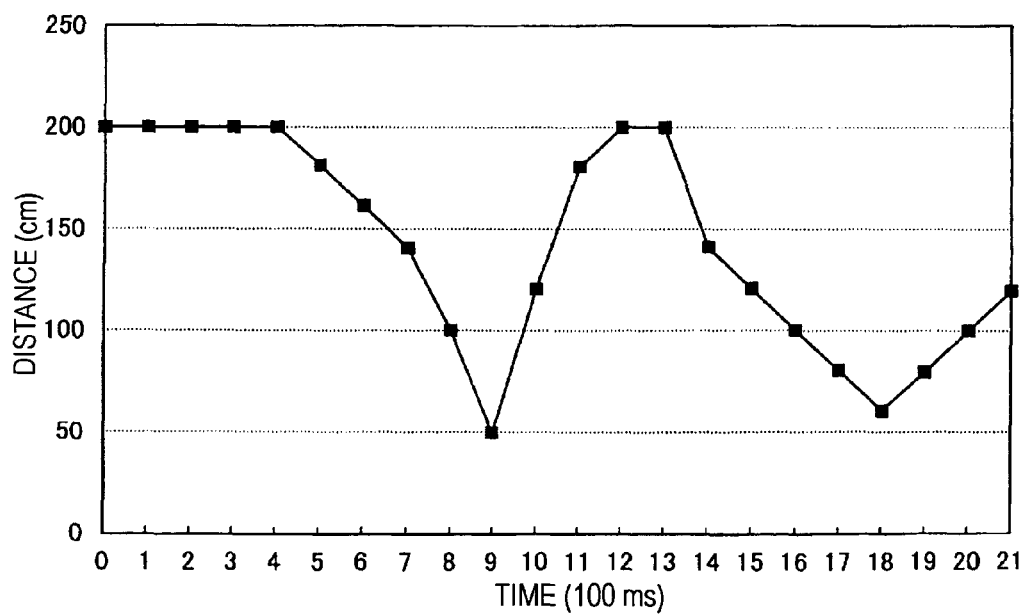
FIG. 4 is a graph showing the relationship between a measured value of an inter-device distance and an elapsed time of the first embodiment.

FIG. 4 shows the relationship between the time elapsed from the start of the measurement and the inter-device distance. In FIG. 4, the predetermined interval at which the distance measurement unit 124 measures the inter-device distance is 100 ms. The horizontal axis represents the elapsed time, and the vertical axis represents the inter-device distance. According to FIG. 4, the inter-device distance is 200 cm until 400 ms have elapsed from the start of the measurement. Thereafter, the inter-device distance becomes gradually shorter and becomes 50 cm when 900 ms have elapsed from the start of the measurement. In order to reflect such changes in the inter-device distance with time in the operations to be executed by the information processing apparatus 104, as has been described above, the measured value of the inter-device distance is stored in the measured distance storage unit 126 in association with the time elapsed from the start of the measurement.

The measured distance storage unit 126 includes a random access memory (RAM) or a flash memory. As has been described above, the measured distance storage unit 126 stores the measured value of the inter-device distance in association with the time elapsed from the start of the measurement. FIG. 5 shows an example of the stored contents of the measured distance storage unit 126. As shown in FIG. 5, an elapsed time 1260 and a measured value 1262 are stored in association with each other in the measured distance storage unit 126. The elapsed time 1260 is the time elapsed from the start of the measurement, which is measured by the timer 122. The measured value 1262 is the measured value of the inter-device distance, which is measured at the associated time stored in the elapsed time 1260. Referring to the stored contents of the measured distance storage unit 126, the inter-device distance is 160 cm at the start of the measurement (0 ms after the start of the measurement); the inter-device distance is 140 cm after 100 ms have elapsed; and the inter-device distance is 100 cm after 200 ms have elapsed. It is clear that the inter-device distance changes with time. In an event 1264, event information including an event serving as the cause of the start of the measurement of the inter-device distance and an event serving as the cause of the end of the measurement is stored. According to FIG. 5, the measurement start event is the pressing of the button of the remote controller 102, and the measurement end event is the elapsing of 500 ms from the start of the measurement. That is, upon reception of the start notification from the notification receiver 120, the distance measurement unit 124 starts measuring the inter-device distance. After the predetermined period of time (500 ms) has elapsed from the start of the measurement, the distance measurement unit 124 ends the measurement.

Referring back to FIG. 2, the functional structure of the information processing apparatus 104 will be described further. The distance measurement unit 124 repeatedly measures the inter-device distance and records the measured value and the elapsed time in the measured distance storage unit 126 periodically at the predetermined time interval until reception of the end notification from the notification receiver 120 or until the predetermined time has elapsed from the start of the measurement or the measured value reaches a predetermined value. When the measurement of the inter-device distance ends, the distance measurement unit 124 notifies the determination unit 128 of the end of the measurement.

On the basis of two ore more than two measured values stored in the measured distance storage unit 126 and a conversion table, the determination unit 128 determines whether the amount of change in the inter-device distance, which is determined from the two or more than two measured values, and the length of time during which this distance change has occurred match any of the time-dependent amounts of change in the inter-device distance, which are set in the conversion table. The conversion table will be described in detail. The conversion table is stored in the conversion table storage unit 130. FIG. 6 shows an example of the conversion table stored in the conversion table storage unit 130.

The conversion table is a table showing an association between time-dependent amounts of change, which are the amounts of change in the inter-device distance within predetermined lengths of time, and operations corresponding to the time-dependent amounts of change. Specifically, as shown in FIG. 6, the conversion table associates a condition number 1300, a time condition 1302, a distance condition 1304, and an operation 1306 with one another.

The condition number 1300 is an identification number that uniquely identifies a condition including a combination of the time condition 1302 and the distance condition 1304. The time condition 1302 is set as a condition of time during which a change in the inter-device distance occurs. As shown in FIG. 6, "within 500 ms" or "after 500 ms" is stored. The reference time of the elapsed time in the time condition 1302 is the inter-device distance measurement start time. In the first embodiment, this is substantially the same as the time at which the button of the remote controller 102 is pressed. Therefore, "within 500 ms" of the user's pressing of the button of the remote controller 102 or "after 500 ms" from the user's pressing of the button of the remote controller 102 is stored as a time condition.

The distance condition 1304 is set as a condition of the inter-device distance or the amount of change thereof. As shown in FIG. 6, "the distance is 3 m or more" (inter-device distance) or "the distance is reduced by 50 cm or more" (the amount of change in the inter-device distance) is set. One condition may include a plurality of combinations of a time condition and a distance condition, such as those shown under the condition numbers 5 and 6.

The operation 1306 stores information indicating the details of an operation to be executing by the information processing apparatus 104 when a condition uniquely specified by the associated condition number 1300 is satisfied.

The condition specified by the condition number 1 and the condition specified by the condition number 6 of FIG. 6 will be described with reference to FIGS. 7A and 7B. FIG. 7A shows the movement of the remote controller 102 satisfying the condition specified by the condition number 1. Upon the user's pressing of the button of the remote controller 102 (to be precise, upon the start of the measurement of the inter-device distance; hereinafter this time will be referred to as the "button pressing time"), the remote controller 102 is at point 102-1, which is 250 cm away from the information processing apparatus 104. When the remote controller 102 is moved to point 102-2, which is 200 cm away form the information processing apparatus 104, within 500 ms of the button pressing time, the distance moved is 50 cm. Thus, the condition specified by the condition number 1 indicating that the distance is reduced by 50 cm within 500 ms is satisfied. Therefore, when the user moves the remote controller 102 in the manner shown in FIG. 7A, the operation associated with the condition number 1 is executed by the information processing apparatus 104, and an icon displayed on the display unit 134 (described below) of the information processing apparatus 104 is enlarged.

FIG. 7B shows the movement of the remote controller 102 satisfying the condition specified by the condition number 6. After 100 ms from the button pressing time, the remote controller 102 is at point 102-1, which is 40 cm away from the information processing apparatus 104. After 300 ms from the button pressing time, the remote controller 102 is at point 102-2, which is 10 cm away from the information processing apparatus 104. Further, after 500 ms from the button pressing time, the remote controller 102 is at point 102-3, which is 60 cm away from the information processing apparatus 104. In such a case, the condition specified by the condition number 6 indicating that the inter-device distance is 30 cm or more after 100 ms, the inter-device distance is 10 cm or less after 300 ms, and the inter-device distance is 30 cm or more after 500 ms is satisfied. Therefore, when the user moves the remote controller 102 in the manner shown in FIG. 7B, the operation associated with the condition number 6 is executed by the information processing apparatus 104, and a file is obtained by the remote controller 102 from the information processing apparatus 104 (that is, a file is transferred from the information processing apparatus 104 to the remote controller 102).

By associating combinations of the time condition and the distance condition with operations to be executed by the information processing apparatus 104 in this manner, the information processing apparatus 104 can execute various operations in accordance with the state of a change in the distance from the information processing apparatus 104 to the remote controller 102. Since the operation to be executed by the information processing apparatus 104 can be changed in accordance with the degree of change in the inter-device distance and the time during which the change has occurred, the user is enabled to perform intuitive control according to the manner in which the combination of the time condition and the distance condition is associated with the operation.

The determination unit 128 determines which of the conditions in the conversion table matches the elapsed time and the measured value stored in the measured distance storage unit 126. Specifically, the determination unit 128 sets a value measured at the time at which the time elapsed from the start of the measurement is zero (that is, at the measurement start time) as a reference measured value. The determination unit 128 computes the amount of change in the inter-device distance by subtracting the reference measured value from a subsequent measured value. The determination unit 128 checks the measured value and the elapsed time against the conditions set in the conversion table to search for a matching condition. If there is a matching condition, the determination unit 128 obtains information regarding the operation associated with the corresponding condition in the conversion table and provides the information to the operation executor 132.

In accordance with the information regarding the operation, which is obtained from the determination unit 128, the operation executor 132 executes the operation associated with the information. The operation executed by the operation executor 132 includes, for example, changing the display state of items displayed on the display unit 134, which will be described subsequently. The items include an icon, a menu, an image, and a file. Specifically, the changing of the display state of an item includes enlarging or reducing the icon, selecting a specific item from the menu, and enlarging, reducing, or rotating the image. Other operations executed by the operation executor 132 include transferring a file stored in the information processing apparatus 104 to the remote controller 102 and obtaining a file stored in the remote controller 102.

The display unit 134 is a display for displaying an icon, a menu, an image, or the like. The display unit 134 may display such items in three dimensions. In this case, an operation executed by the processing executor 132 may involve an instruction in the z-direction, such as selecting a nearer image or a further image when these images are displayed overlapping each other, that is, an image displayed in the foreground (toward the user viewing images or the like displayed on the display unit 134) and an image displayed in the background (far away from the user) overlap each other.

Figure 8:
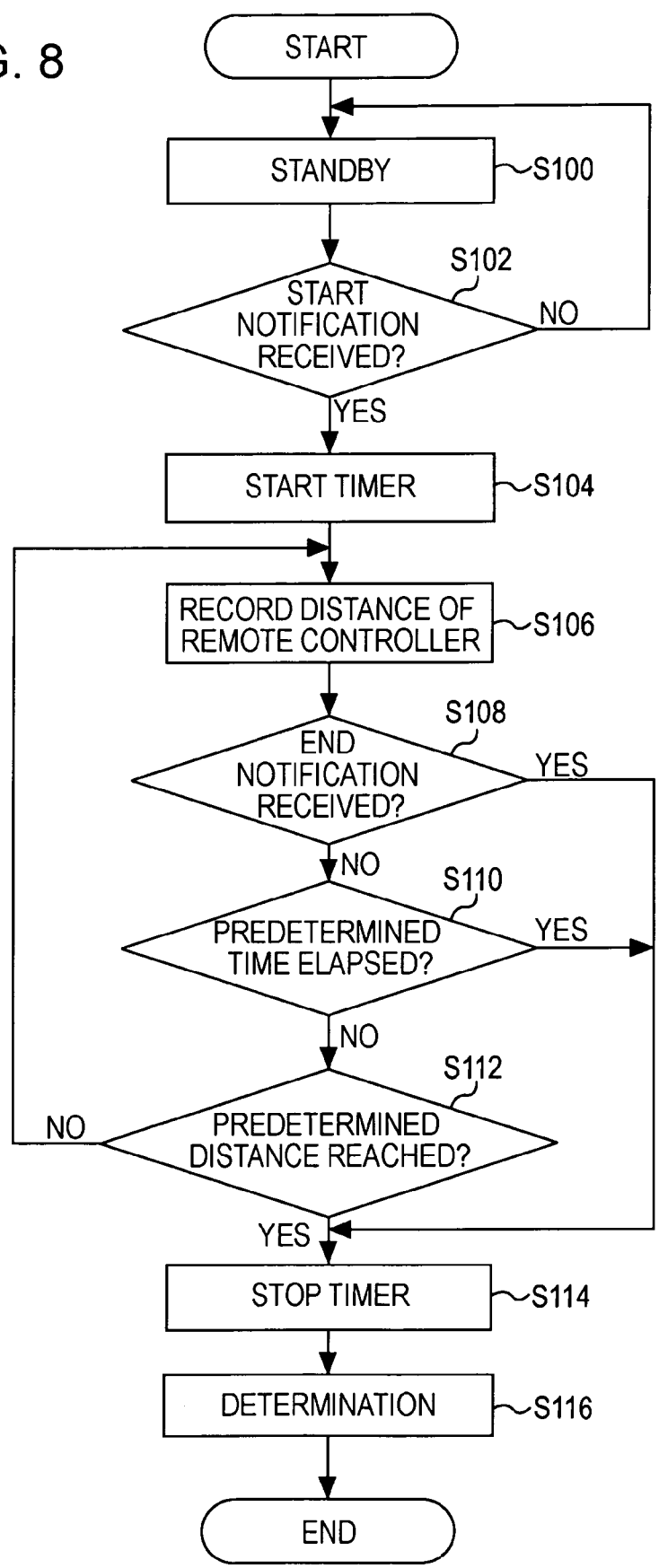
FIG. 8 is a flowchart of an information processing flow of the information processing apparatus of the first embodiment.
Figure 9:
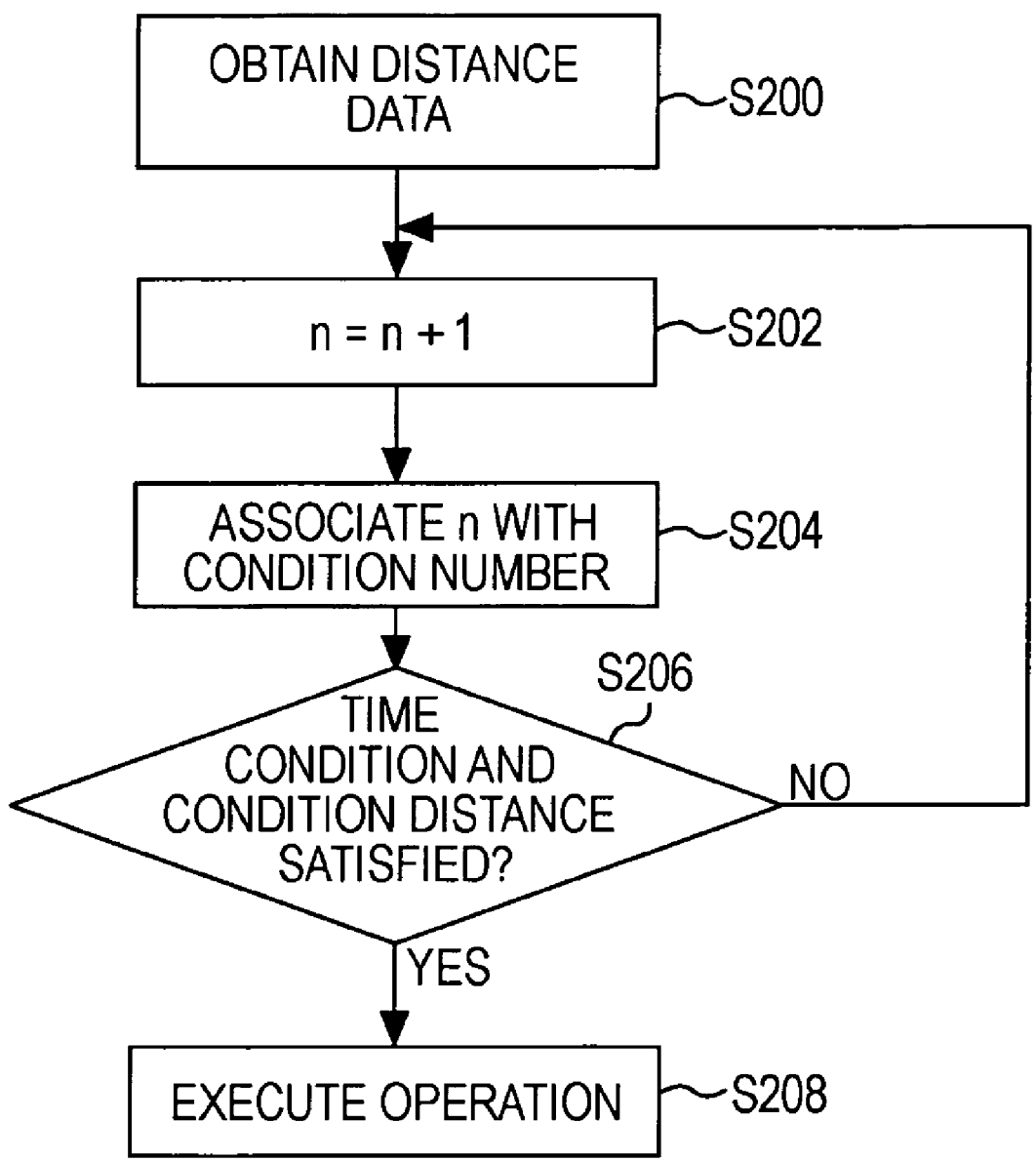
FIG. 9 is a flowchart of an information processing flow of the information processing apparatus of the first embodiment.

The functional structure of the remote controller 102 and the information processing apparatus 104 has been described as above. With reference to FIGS. 8 and 9, the flow of the operation executed by the information processing apparatus 104 in the case where the information processing apparatus 104 is controlled by the remote controller 102 will be described.

The information processing apparatus 104 waits for the start notification from the remote controller 102 (S100 and S102). Upon reception of the start notification from the remote controller 102 (S102), the information processing apparatus 104 starts the timer 122 (S104) and measures and records the inter-device distance (S106). Upon reception of the end notification from the remote controller 102 (S108), after a predetermined period of time has elapsed from the start of the measurement (S110), or when the measured value reaches a predetermined value (S112), the information processing apparatus 104 stops the timer 122 and ends the measurement of the inter-device distance (S114), and performs the determination (S116).

FIG. 9 shows the flow of the determination in detail. The information processing apparatus 104 obtains distance data, which is a combination of the measured value and the elapsed time, and stores the value 0 in variable n (S200). The information processing apparatus 104 increments variable n by one (S202), associates the variable n with the condition number of the conversion table (S204), and determines whether the distance data satisfies the time condition and the distance condition set under the condition number n (S206). If the determination is negative, the flow returns to S202 and determines whether the distance data satisfies the conditions set under the next condition number. In contrast, if the determination is affirmative, the operation associated with the conditions under the corresponding condition number is executed (S208).

The flow of the operation of the information processing apparatus 104 has been described as above. According to the remote control system 100 of the first embodiment, in accordance with a change in the distance from the information processing apparatus 104 to the remote controller 102 and the time during which the change has occurred, the preliminary associated operation is executed by the information processing apparatus 104. Since the operations can be associated with the corresponding combinations of the time condition and the distance condition, the information processing apparatus 104 can execute many and various operations.

Second Embodiment

Figure 10:
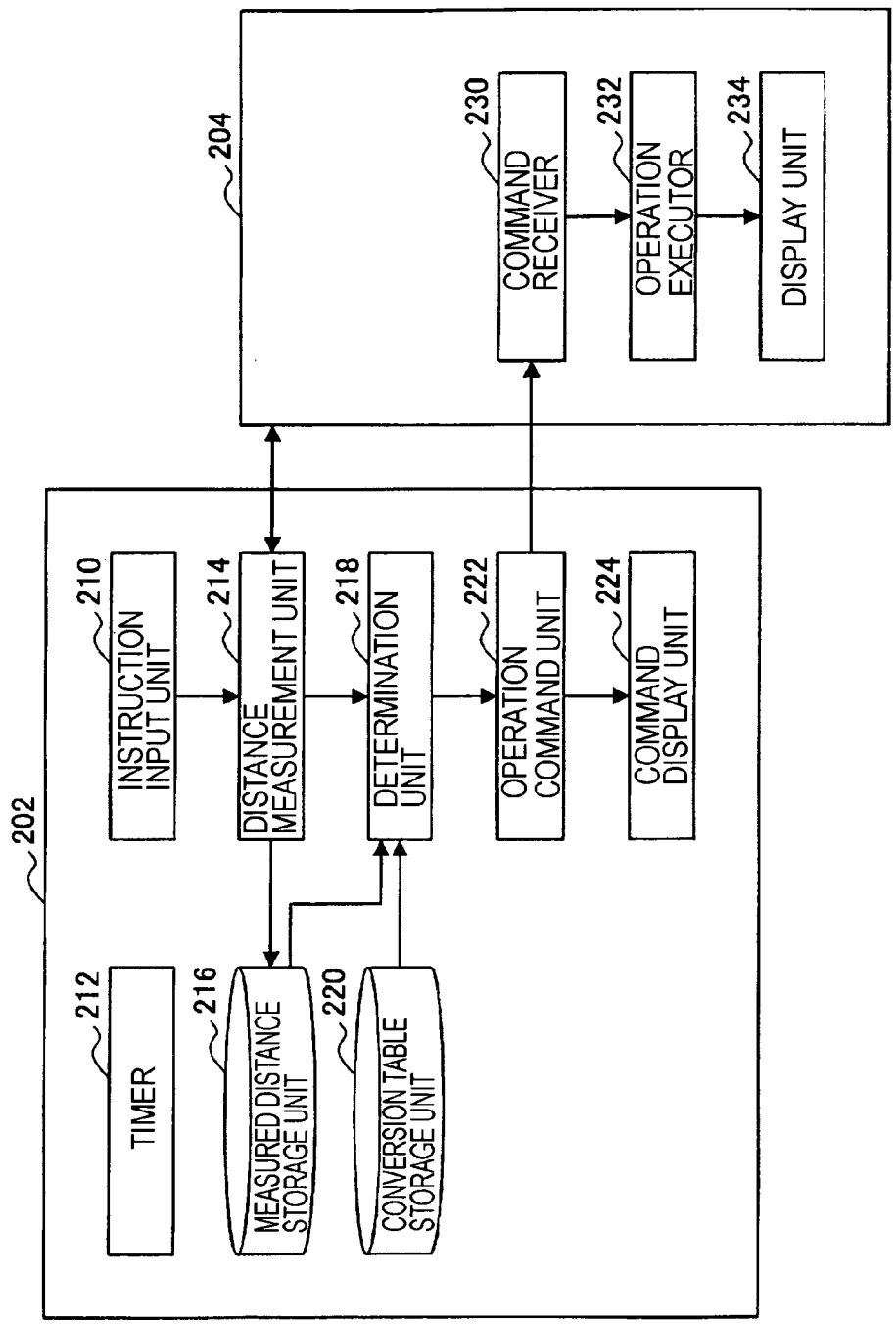
FIG. 10 is a functional block diagram of a remote controller and an information processing apparatus according to a second embodiment of the present invention.

With reference to FIG. 10, in a remote control system 200 according to the second embodiment, a remote controller 202 measures the distance from the remote controller 202 to an information processing apparatus 204 and instructs the information processing apparatus 204 to execute an operation associated in advance with the measured distance or the like. The functional structure of the remote controller 202 and the information processing apparatus 204 will be described. The remote controller 202 is equipped with, for example, an instruction input unit 210, a timer 212, a distance measurement unit 214, a measured distance storage unit 216, a determination unit 218, a conversion table storage unit 220, an operation command unit 222, and a command display unit 224. Detailed descriptions of elements having substantially the same functions as those in the first embodiment are omitted.

The instruction input unit 210 has substantially the same function as that of the instruction input unit 110 of the first embodiment. The instruction input unit 210 receives an instruction from the user and provides the received instruction to the distance measurement unit 214. The instruction from the user includes a start instruction for starting the recording of the inter-device distance, which is the distance from the information processing apparatus 204 to the remote controller 202, and an end instruction for ending the recording of the inter-device distance. Specifically, for example, as in the first embodiment, the remote controller 202 is equipped with a button. When the button is pressed, the instruction input unit 210 may input a start instruction, and, when the pressing of the button is released, the instruction input unit 210 may input an end instruction as the instruction from the user to the distance measurement unit 214.

The timer 212 has substantially the same function as that of the timer 122 of the information processing apparatus 104 in the first embodiment. In response to the start of the measurement of the inter-device distance by the distance measurement unit 214, the timer 212 is turned on and starts measuring time. In response to the end of the measurement of the inter-device distance by the distance measurement unit 214, the timer 212 is turned off and ends the measurement of time. That is, the timer 212 measures the time elapsed from the start of the measurement of the inter-device distance.

The distance measurement unit 214 has substantially the same function as that of the distance measurement unit 124 of the information processing apparatus 104 in the first embodiment. The distance measurement unit 214 measures the distance from the remote controller 202 to the information processing apparatus 204 periodically at a predetermined time interval.

The measured distance storage unit 216 has substantially the same function as that of the measured distance storage unit 126 of the information processing apparatus 104 in the first embodiment. The measured distance storage unit 216 stores the measured value of the inter-device distance and the time elapsed from the start of the measurement in association with each other.

The conversion table storage unit 220 has substantially the same function as that of the conversion table storage unit 130 of the information processing apparatus 104 in the first embodiment. The conversion table storage unit 220 stores a conversion table showing an association between time-dependent amounts of change, which are the amounts of change in the inter-device distance within predetermined lengths of time, and operations corresponding to the time-dependent amounts of change.

The determination unit 218 has substantially the same function as that of the determination unit 128 of the information processing apparatus 104 in the first embodiment. The determination unit 218 determines which of the conditions in the conversion table matches the elapsed time and the measured value stored in the measured distance storage unit 216. The determination unit 218 obtains information regarding the operation associated with the corresponding condition in the conversion table and provides the information to the operation command unit 222.

In accordance with the information regarding the operation, which is obtained from the determination unit 218, the operation command unit 222 gives a command to allow the information processing apparatus 204 to execute the operation associated with the information to the information processing apparatus 204. Specifically, for example, the operation command unit 222 transmits an identifier specifying the operation to be executed by the information processing apparatus 204 or a parameter or the like necessary for the operation to the information processing apparatus 204. In the information processing apparatus 204, communication between a command receiver 230 for receiving the operation command from the remote controller 202 and the operation command unit 222 may be wireless, as in UWB communication, or via wire. The operation command unit 222 displays, on the command display unit 224, information regarding the operation commanded to be executed by the information processing apparatus 204.

The command display unit 224 is a display capable of displaying the information regarding the operation, which is obtained from the operation command unit 222, and includes, for example, a liquid crystal display (LCD) or a light-emitting diode (LED). By displaying the information regarding the operation commanded to be executed by the information processing apparatus 204 on the command display unit 224, the user can check the operation currently being executed by the information processing apparatus 204.

The information processing apparatus 204 is equipped with, for example, the command receiver 230, an operation executor 232, and a display unit 234. The command receiver 230 receives, from the remote controller 202, the information regarding the operation to be executed by the information processing apparatus 204. The command receiver 230 provides the received information regarding the operation to the operation executor 232.

The operation executor 232 obtains the information regarding the operation from the command receiver 230 and executes the associated operation. The display unit 234 displays, as in the display unit 134 of the first embodiment, the result of the operation executed by the operation executor 232.

Figure 11:
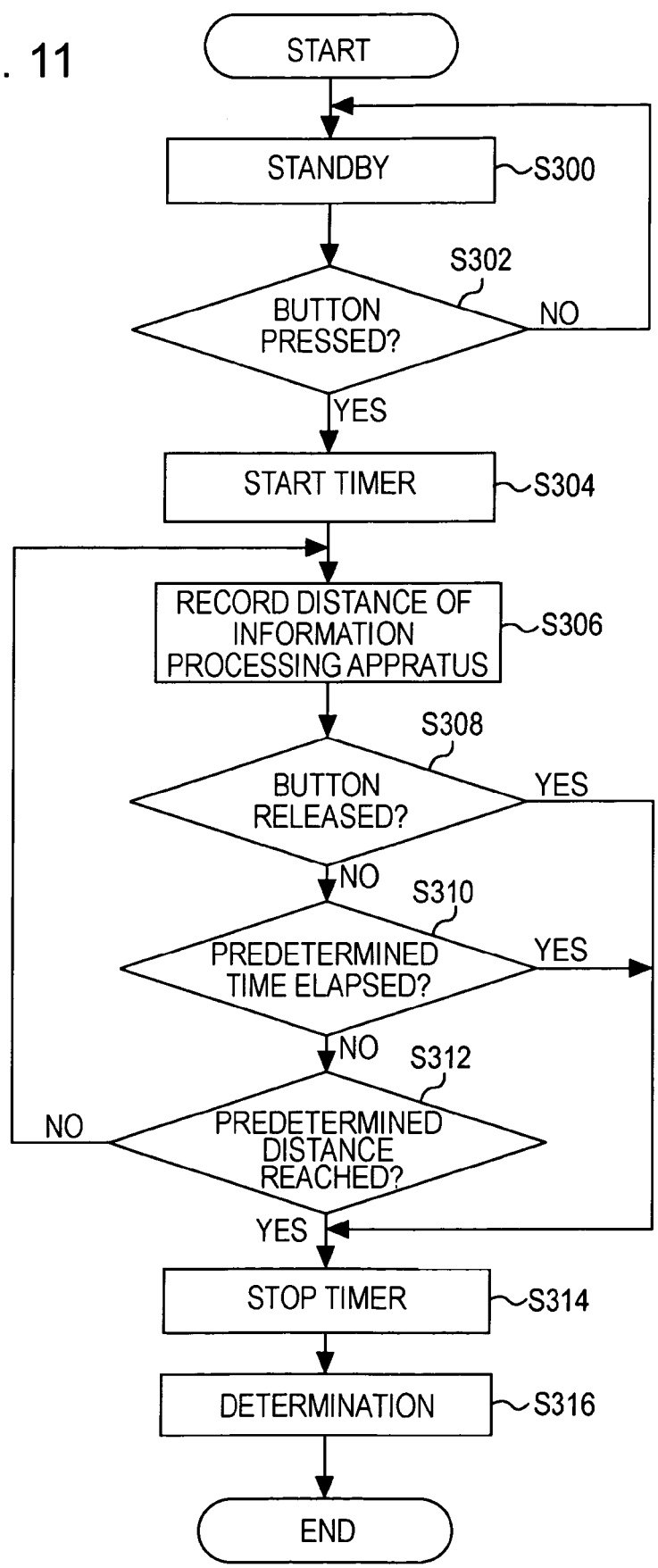
FIG. 11 is a flowchart of an information processing flow of the remote controller of the second embodiment.
Figure 12:
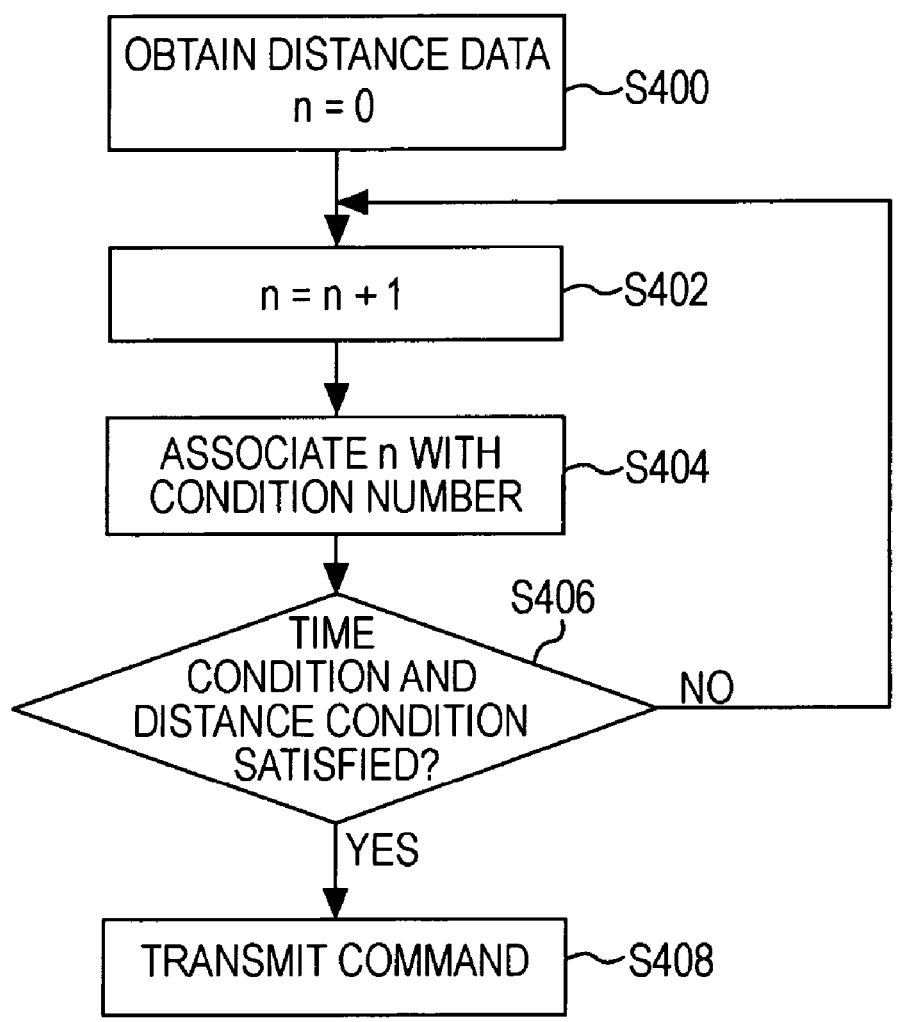
FIG. 12 is a flowchart of an information processing flow of the remote controller of the second embodiment.

The functional structure of the remote controller 202 and the information processing apparatus 204 according to the second embodiment has been described as above. With reference to FIGS. 11 and 12, the flow of the operation performed by the remote controller 202 in the case where the remote controller 202 remotely controls the information processing apparatus 104 will be described.

The remote controller 202 waits for the user's pressing of the button (S300 and S302). When the button is pressed (S302), the remote controller 202 starts the timer 212 (S304) and measures and records the inter-device distance (S306). When the button is pressed and then released (S308), after a predetermined period of time has elapsed from the start of the measurement (S310), or when the measured value reaches a predetermined value (S312), the remote controller 202 stops the timer 212 and ends the measurement of the inter-device distance (S314), and performs the determination (S316).

FIG. 12 shows the flow of the determination in detail. The remote controller 202 obtains distance data, which is a combination of the measured value and the elapsed time, and stores the value 0 in variable n (S400). The remote controller 202 increments variable n by one (S402), associates the variable n with the condition number of the conversion table (S404), and determines whether the distance data satisfies the time condition and the distance condition set under the condition number n (S406). If the determination is negative, the flow returns to S402 and determines whether the distance data satisfies the conditions set under the next condition number. In contrast, if the determination is affirmative, an execution command for allowing the information processor 204 to execute the operation associated with the conditions under the corresponding condition number is transmitted to the information processing apparatus 204 (S408).

The flow of the operation of the remote controller 202 has been described as above. According to the remote control system 200 of the second embodiment, in accordance with a change in the distance from the information processing apparatus 204 to the remote controller 202 and the time during which the change in the inter-device distance has occurred, the information processing apparatus 204 is allowed to execute the preliminary associated operation. Since the operations can be associated with the corresponding combinations of the time condition and the distance condition, the information processing apparatus 204 can execute many and various operations. Since the operation to be executed by the information processing apparatus 204 can be changed in accordance with the degree of change in the inter-device distance and the time during which the change has occurred, the user is enabled to perform intuitive control according to the manner in which the combination of the time condition and the distance condition is associated with the operation.

In the above-described two embodiments, the information processing apparatus or the remote controller measures the inter-device distance several times and, after the measurement is completed, checks the measurement results against the conditions set in the conversion table. However, the present invention is not limited to these examples. The information processing apparatus or the remote controller may continue measuring the inter-device distance and, every time the measurement is performed, may check the measurement results against the conditions set in the conversion table. Alternatively, the checking operation may be performed every predetermined number of times the measurement is performed.

In the above-described two embodiments, the inter-device distance is measured by the information processing apparatus or the remote controller periodically at the predetermined time interval, such as 100 ms. However, the present invention is not limited to these examples. For example, the measurement may be performed at irregular intervals, such as performing the first measurement at the start of the measurement, the second measurement after 100 ms, and the third measurement after 300 ms. In such a case, it is necessary to store, besides the sequence of measurements of the measured values, the measurement time and date of each measured value or the timer value associated with each measured value, as in the above embodiments, so that the time elapsed from the start of the measurement is clear.

In the above-described two embodiments, the amount of change in the inter-device distance is calculated on the basis of the difference between the reference measured value, which is the first measured value (at the measurement start time), from among a plurality of measured values stored in the measured value storage unit, and a subsequent measured value. However, the present invention is not limited to this example. On the basis of the amount of change calculated from a (reference) measured value other than the first measured value and another measured value measured and stored subsequent to the reference measured value, it may be possible to determine whether the amount of change satisfies any of the conditions set in the conversion table.

In the above-described two embodiments, the start instruction for starting the recording of the inter-device distance is given by pressing the button of the remote controller. However, the present invention is not limited to this example. For example, the remote controller may be equipped with a sensor, such as a velocity sensor or an angular velocity sensor, for detecting the movement of the remote controller, and, when the sensor detects the movement of the remote controller, the start instruction for starting the recording of the inter-device distance may be generated.

Although the preferred embodiments of the present invention have been described with reference to the accompanying drawings, the present invention is not limited to these embodiments. It should be understood by those skilled in the art that a variety of modifications or changes may be made without departing from the technical scope of the invention set forth in the appended claims, and these modifications or changes may also be embraced in the scope of the present invention.

What is claimed is:

1. A remote control system comprising:
    an information processing apparatus; and
    a remote controller that remotely controls the information processing apparatus and includes a button for receiving an input from a user,
    wherein the remote controller includes a start notification transmitter that transmits, to the information processing apparatus, a start notification for causing the information processing apparatus to start recording an inter-device distance, which is the distance from the information processing apparatus to the remote controller, when the remote controller receives the input from the user at the button, and
    wherein the information processing apparatus includes
    a storage unit which stores a conversion table showing at least one association between a threshold time-dependent distance change, which is a minimum change in the inter-device distance, a threshold time condition which indicates a state of being within or after a predetermined time elapsed from receipt of the start notification from the remote controller, and an operation which will be performed when the time-dependent distance change is reached at the threshold time condition,
    a start notification receiver that receives the start notification from the remote controller,
    a distance measurement unit that measures the inter-device distance periodically at a predetermined time interval upon receipt of the start notification,
    a measured distance storage unit that stores a measured value of the inter-device distance at each predetermined time interval, which is measured by the distance measurement unit, to generate a sequence of measurements,
    a determination unit that determines whether a predetermined period of time has elapsed from the start of the measurement of the inter-device distance and when it is determined that the predetermined period of time has elapsed, the distance measurement unit stops measuring the inter-device distance periodically at the predetermined time interval and the determination unit determines whether a measured change in the inter-device distance, which is determined from two or more measured values stored in the measured distance storage unit, and the length of time elapsed from the receipt of the start notification from the remote controller during which the measured change in the inter-device distance has occurred, match an associated threshold time-dependent distance change and threshold time condition, which is set in the conversion table, and
    an operation executor that executes, when the match is obtained by the determination unit, the operation associated with the threshold time-dependent distance change and threshold time condition set in the conversion table.

2. The information processing apparatus according to claim 1, wherein the determination unit compares the measured change to each of the associations between the threshold time-dependent distance change and the threshold time condition sequentially until it is determined that the measured change matches one of the associated threshold time-dependent distance change and threshold time condition.

3. An information processing apparatus remotely controlled by a remote controller which includes a button for receiving an input from a user, comprising:
    a start notification receiver that receives a start notification from the remote controller when the remote controller receives the input from the user at the button;
    a distance measurement unit that measures an inter-device distance, which is the distance from the information processing apparatus to the remote controller, periodically at a predetermined time interval upon receipt of the start notification;
    a storage unit which stores a conversion table showing at least one association between a threshold time-dependent distance change, which is a minimum change in the inter-device distance, a threshold time condition which indicates a state of being within or after a predetermined time elapsed from receipt of the start notification from the remote controller, and an operation which will be performed when the time-dependent distance change is reached at the threshold time condition;
    a measured distance storage unit that stores a measured value of the inter-device distance at each predetermined time interval, which is measured by the distance measurement unit, to generate a sequence of measurements;
    a determination unit that determines whether a predetermined period of time has elapsed from the start of the measurement of the inter-device distance and when it is determined that the predetermined period of time has elapsed, the distance measurement unit stops measuring the inter-device distance periodically at the predetermined time interval and the determination unit determines whether a measured change in the inter-device distance, which is determined from two or more measured values stored in the measured distance storage unit, and the length of time elapsed from the receipt of the start notification from the remote controller during which the measured change in the inter-device distance has occurred, match an associated time-dependent distance change and threshold time condition, which is set in the conversion table; and
    an operation executor that executes, when the match is obtained by the determination unit, the operation associated with the threshold time-dependent distance change and threshold time condition set in the conversion table.

4. The information processing apparatus according to claim 3, wherein the measured distance storage unit stores the measured value in association with time information specifying a time at which the measured value is measured by the distance measurement unit.

5. The information processing apparatus according to claim 3, wherein the determination unit performs the determination periodically at the predetermined time interval.

6. The information processing apparatus according to claim 3, wherein the determination unit performs the determination when the measured value measured by the distance measurement unit is a predetermined value.

7. The information processing apparatus according to claim 3, further comprising:

an end notification receiver that receives, from the remote controller, an end notification instructing ending of recording of the inter-device distance, wherein the determination unit performs the determination when the end notification receiver receives the end notification.

8. The information processing apparatus according to claim 3, wherein the distance measurement unit includes a sensor that transmits a packet to the remote controller, receives a response packet associated with the transmitted packet from the remote controller, and computes a round-trip transmission time of the packet on the basis of necessary time from transmission of the packet to reception of the response packet, and a distance calculator that calculates the inter-device distance on the basis of the round-trip transmission time.

9. The information processing apparatus according to claim 3, further comprising:

a display unit, wherein the operation executor changes the display state of an item displayed on the display unit.

10. The information processing apparatus according to claim 9, wherein the display unit is capable of displaying the item in three dimensions.

11. A non-transitory computer readable medium including computer executable instructions, wherein the instructions, when executed by an information processing apparatus controlled by a remote controller which includes a button for receiving an input from a user, cause the information processing apparatus to perform a method comprising:

receiving a start notification from the remote controller when the remote controller receives the input from the user at the button;

measuring an inter-device distance, which is the distance from the information processing apparatus to the remote controller, periodically at a predetermined time interval upon receipt of the start notification;

recording a measured value of the inter-device distance at each predetermined time interval to generate a sequence of measurements;

determining whether a predetermined period of time has elapsed from the start of the measurement of the inter-device distance and when it is determined that the predetermined period of time has elapsed, stopping the measurement of the inter-device distance periodically at the predetermined time interval and determining, on the basis of a conversion table stored in a storage unit showing at least one association between a threshold time-dependent distance change, which is a minimum change in the inter-device distance, a threshold time condition which indicates a state of being within or after a predetermined time elapsed from receipt of the start notification from the remote controller, and an operation which will be performed when the time-dependent distance change is reached at the threshold time condition, whether a measured change in the inter-device distance, which is determined from two or more recorded measured values, and the length of time elapsed from the receipt of the start notification from the remote controller during which the measured change in the inter-device distance has occurred, match an associated threshold time-dependent distance change and threshold time condition, which is set in the conversion table; and executing, when the match is obtained as a result of the determination, the operation associated with the threshold time-dependent distance change and threshold time condition set in the conversion table.

12. An information processing method for an information processing apparatus remotely controlled by a remote controller which includes a button for receiving an input from a user, the method comprising:

receiving, at the information processing apparatus, a start notification from the remote controller when the remote controller receives the input from the user at the button;

measuring, at the information processing apparatus, an inter-device distance, which is the distance from the information processing apparatus to the remote controller, periodically at a predetermined time interval upon receipt of the start notification;

recording, at the information processing apparatus, a measured value of the inter-device distance at each predetermined time interval to generate a sequence of measurements;

determining, at the information processing apparatus, whether a predetermined period of time has elapsed from the start of the measurement of the inter-device distance and when it is determined that the predetermined period of time has elapsed, stopping the measurement of the inter-device distance periodically at the predetermined time interval and determining, on the basis of a conversion table stored in a storage unit showing at least one association between a threshold time-dependent distance change, which is a minimum change in the inter-device distance, a threshold time condition which indicates a state of being within or after a predetermined time elapsed from receipt of the start notification from the remote controller, and an operation which will be performed when the time-dependent distance change is reached at the threshold time condition, whether a measured amount of change in the inter-device distance, which is determined from two or more recorded measured values, and the length of time elapsed from the receipt of the start notification from the remote controller during which the measured change in the inter-device distance has occurred match an associated threshold time-dependent distance change and threshold time condition, which is set in the conversion table; and executing, at the information processing apparatus, when the match is obtained as a result of the determination, the operation associated with the threshold time-dependent distance change and threshold time condition set in the conversion table.

13. A remote controller for remotely controlling an information processing apparatus, comprising:

a button for receiving an input from a user;

a distance measurement unit that measures an inter-device distance, which is the distance from the information processing apparatus to the remote controller, periodically at a predetermined time interval when the user inputs a start notification at the button;

a storage unit which stores a conversion table showing at least one association between a threshold time-dependent distance change, which is a minimum change in the inter-device distance, a threshold time condition which indicates a state of being within or after a predetermined time elapsed from receipt of the start notification, and an operation which will be performed when the time-dependent distance change is reached at the threshold time condition;

a measured distance storage unit that stores a measured value of the inter-device distance at each predetermined time interval, which is measured by the distance measurement unit, to generate a sequence of measurements;

a determination unit that determines whether a predetermined period of time has elapsed from the start of the measurement of the inter-device distance and when it is determined that the predetermined period of time has elapsed, the distance measurement unit stops measuring the inter-device distance periodically at the predetermined time interval and the determination unit determines whether a change in the measured inter-device distance, which is determined from two or more measured values stored in the measured distance storage unit, and the length of time elapsed from the receipt of the start notification inputted by the user during which the measured change in the inter-device distance has occurred, match an associated threshold time-dependent distance change and threshold time condition, which is set in the conversion table; and an operation command unit that commands, when the match is obtained by the determination unit, the information processing apparatus to execute the operation associated with the threshold time-dependent distance change and threshold time condition set in the conversion table.

14. The remote controller according to claim 13, further comprising:

a recording start instruction unit that gives an instruction to the distance measurement unit to start recording the inter-device distance, wherein the distance measurement unit starts measuring the inter-device distance upon reception of the instruction from the recording start instruction unit.

15. The remote controller according to claim 14, further comprising:

a recording end instruction unit that gives an instruction to the distance measurement unit to end recording the inter-device distance, wherein the determination unit performs the determination upon reception of the instruction from the recording end instruction unit.

16. The remote controller according to claim 13, further comprising:

a command display unit, wherein the operation command unit allows the command display unit to display information specifying an operation commanded to be executed by the information processing apparatus.

17. A computer readable storage medium including computer executable instructions, wherein the instructions, when executed by a remote controller for remotely controlling an information processing apparatus which includes a button for receiving an input from a user, cause the remote controller to perform a method comprising:

receiving a start notification input by the user at the button;

measuring an inter-device distance, which is the distance from the information processing apparatus to the remote controller, periodically at a predetermined time interval when the user inputs the start notification at the button;

recording a measured value of the inter-device distance at each predetermined time interval to generate a sequence of measurements;

determining whether a predetermined period of time has elapsed from the start of the measurement of the inter-device distance and when it is determined that the predetermined period of time has elapsed, stopping the measurement of the inter-device distance periodically at the predetermined time interval and determining, on the basis of a conversion table stored in a storage unit showing at least one association between a threshold time-dependent distance change, which is a minimum change in the inter-device distance, a threshold time condition which indicates a state of being within or after a predetermined time elapsed from receipt of the start notification, and an operation which will be performed when the time-dependent distance change is reached at the threshold time condition, whether a measured change in the inter-device distance, which is determined from two or more recorded measured values, and the length of time elapsed from the receipt of the start notification from the user during which the measured change in the inter-device distance has occurred, match an associated threshold time-dependent distance change and threshold time condition, which is set in the conversion table; and commanding, when the match is obtained as a result of the determination, the information processing apparatus to execute the operation associated with the threshold time-dependent distance change and threshold time condition set in the conversion table.

18. A remote control method for a remote controller which includes a button for receiving an input from a user for remotely controlling an information processing apparatus, comprising:

receiving, at the remote controller, a start notification input by the user at the button;

measuring, at the remote controller, an inter-device distance, which is the distance from the information processing apparatus to the remote controller, periodically at a predetermined time interval when the user inputs the start notification at the button;

recording, at the remote controller, a measured value of the inter-device distance at each predetermined time interval to generate a sequence of measurements;

determining, at the remote controller, whether a predetermined period of time has elapsed from the start of the measurement of the inter-device distance and when it is determined that the predetermined period of time has elapsed, stopping the measurement of the inter-device distance periodically at the predetermined time interval and determining, on the basis of a conversion table stored in a storage unit showing at least one association between a threshold time-dependent distance change, which is a minimum change in the inter-device distance, a threshold time condition which indicates a state of being within or after a predetermined time elapsed from receipt of the start notification, and an operation which will be performed when the time-dependent distance change is reached at the threshold time condition, whether a measured change in the inter-device distance, which is determined from two or more recorded measured values, and the length of time elapsed from the receipt of the start notification from the user during which the measured change in the inter-device distance has occurred, match an associated threshold time-dependent distance change and threshold time condition, which are set in the conversion table; and commanding, at the remote controller, when the match is obtained as a result of the determination, the information processing apparatus to execute the operation associated with the threshold time-dependent distance change and threshold time condition set in the conversion table.

* * * * *